(12) United States Patent
Kamakura et al.

(10) Patent No.: US 10,888,929 B2
(45) Date of Patent: *Jan. 12, 2021

(54) SHEET AND COMPOSITE SHEET

(71) Applicant: NITTO DENKO CORPORATION, Ibaraki (JP)

(72) Inventors: Nao Kamakura, Ibaraki (JP); Yuki Sugo, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/762,504

(22) PCT Filed: Sep. 21, 2016

(86) PCT No.: PCT/JP2016/077833
§ 371 (c)(1),
(2) Date: Mar. 22, 2018

(87) PCT Pub. No.: WO2017/057127
PCT Pub. Date: Apr. 6, 2017

(65) Prior Publication Data
US 2018/0257142 A1    Sep. 13, 2018

(30) Foreign Application Priority Data

Sep. 30, 2015 (JP) ................. 2015-193244

(51) Int. Cl.
| | | |
|---|---|---|
| *B32B 27/20* | (2006.01) | |
| *B22F 7/08* | (2006.01) | |
| *B32B 27/36* | (2006.01) | |
| *B32B 9/00* | (2006.01) | |
| *B22F 7/06* | (2006.01) | |
| *H01L 21/683* | (2006.01) | |
| *C09J 7/10* | (2018.01) | |
| *H01L 23/00* | (2006.01) | |
| *C09J 9/00* | (2006.01) | |
| *B22F 3/02* | (2006.01) | |
| *B22F 1/00* | (2006.01) | |
| *B32B 7/06* | (2019.01) | |
| *C08K 3/22* | (2006.01) | |
| *C08K 3/08* | (2006.01) | |
| *H01L 23/31* | (2006.01) | |

(52) U.S. Cl.
CPC .............. *B22F 7/08* (2013.01); *B22F 1/0059* (2013.01); *B22F 3/02* (2013.01); *B22F 7/064* (2013.01); *B32B 7/06* (2013.01); *B32B 9/00* (2013.01); *B32B 27/20* (2013.01); *B32B 27/36* (2013.01); *B32B 27/365* (2013.01); *C09J 7/10* (2018.01); *C09J 9/00* (2013.01); *H01L 21/6836* (2013.01); *H01L 24/83* (2013.01); *C08K 2003/085* (2013.01); *C08K 2003/0806* (2013.01); *C08K 2003/2248* (2013.01); *C08K 2003/2286* (2013.01); *C09J 2203/326* (2013.01); *C09J 2301/304* (2020.08); *C09J 2301/408* (2020.08); *C09J 2469/00* (2013.01); *H01L 23/3121* (2013.01); *H01L 2221/68327* (2013.01); *H01L 2221/68377* (2013.01); *H01L 2224/48091* (2013.01); *H01L 2224/73265* (2013.01); *H01L 2224/83191* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 5,413,691 A | * | 5/1995 | Kaneyasu | .......... G01N 27/4074 |
| | | | | 204/424 |
| 2001/0014492 A1 | * | 8/2001 | Noguchi | ............. H01L 21/6836 |
| | | | | 438/118 |
| 2007/0000595 A1 | * | 1/2007 | Prack | ...................... B24B 37/30 |
| | | | | 156/154 |
| 2007/0141288 A1 | * | 6/2007 | Hongo | .................... C09J 7/385 |
| | | | | 428/40.1 |
| 2008/0035244 A1 | | 2/2008 | Suzuki et al. | |
| 2008/0311349 A1 | | 12/2008 | Johnson et al. | |
| 2010/0006998 A1 | * | 1/2010 | Masuda | ................. C08G 59/08 |
| | | | | 257/678 |
| 2011/0171410 A1 | | 7/2011 | Nakagawa et al. | |
| 2012/0177897 A1 | | 7/2012 | Jablonski et al. | |
| 2012/0251381 A1 | * | 10/2012 | Bedworth | ................ C09K 5/14 |
| | | | | 420/469 |
| 2014/0008588 A1 | | 1/2014 | Fujimoto et al. | |
| 2014/0216798 A1 | * | 8/2014 | Kawato | .................. H01B 1/026 |
| | | | | 174/257 |
| 2014/0231983 A1 | * | 8/2014 | Sugo | ........................ H01L 21/50 |
| | | | | 257/734 |
| 2015/0024211 A1 | * | 1/2015 | Miratsu | .................... C08K 3/10 |
| | | | | 428/412 |
| 2015/0353804 A1 | * | 12/2015 | Ghosal | ................... B82Y 30/00 |
| | | | | 419/8 |

(Continued)

FOREIGN PATENT DOCUMENTS

| | | |
|---|---|---|
| CN | 101065204 A | 10/2007 |
| CN | 101184614 A | 5/2008 |

(Continued)

OTHER PUBLICATIONS

Linda W. Vick and Ronald G. Kander, "Pressureless Sintering of Polycarbonate Powder Compacted at Ambient Temperature", Dec. 1998, vol. 38, No. 12, Polymer Engineering and Science, pp. 1985-1996 (Year: 1998).*

(Continued)

*Primary Examiner* — Anish P Desai
(74) *Attorney, Agent, or Firm* — Alleman Hall Creasman & Tuttle LLP

(57) ABSTRACT

A problem is to provide a sheet which is such that a sintered body produced following sintering has a small amount of remaining organic substances. Solution means relate to a sheet comprising a pre-sintering layer. The pre-sintering layer comprises polycarbonate.

20 Claims, 3 Drawing Sheets

(56) References Cited

U.S. PATENT DOCUMENTS

| | | | |
|---|---|---|---|
| 2016/0136763 A1 | 5/2016 | Endoh et al. | |
| 2016/0254243 A1 | 9/2016 | Kurita et al. | |
| 2018/0030203 A1* | 2/2018 | Nakano | C08L 69/00 |
| 2018/0257142 A1 | 9/2018 | Kamakura et al. | |

FOREIGN PATENT DOCUMENTS

| | | | | |
|---|---|---|---|---|
| CN | 101772831 A | 7/2010 | | |
| CN | 102051137 A | 5/2011 | | |
| CN | 102510783 A | 6/2012 | | |
| CN | 103992755 A | 8/2014 | | |
| CN | 104212369 A | 12/2014 | | |
| EP | 2770032 A2 | 8/2014 | | |
| EP | 2960930 A1 | 12/2015 | | |
| EP | 3239258 A1 | 11/2017 | | |
| JP | 2002030306 A | 1/2002 | | |
| JP | 2005506901 A | 3/2005 | | |
| JP | 2010254763 A | 11/2010 | | |
| JP | 20154105 A | 1/2015 | | |
| JP | 201579650 A | 4/2015 | | |
| JP | 2015103649 A | 6/2015 | | |
| TW | 201629455 A | 8/2016 | | |
| WO | 03035279 A1 | 5/2003 | | |
| WO | 2012128028 A1 | 9/2012 | | |
| WO | 2014068299 A1 | 5/2014 | | |
| WO | 2014108518 A1 | 7/2014 | | |
| WO | 2014129626 A1 | 8/2014 | | |
| WO | 2015034579 A1 | 3/2015 | | |
| WO | WO-2015034579 A1 * | 3/2015 | ........... | B23K 35/302 |
| WO | 2015060346 A1 | 4/2015 | | |
| WO | WO-2016139831 A1 * | 9/2016 | ............... | C08K 3/00 |
| WO | WO-2016182663 A1 * | 11/2016 | ............. | B32B 27/00 |

OTHER PUBLICATIONS

Technical data sheet of poly(propylene carbonate) Qpac 40, Empower Materials, retrieved from internet on Jul. 11, 2019. (Year: 2019).*

Katsuhiko Oikawa, "A Fibrous Structure A Method for Manufacturing Such", English translation of JP 2002-030306 A,, Jan. 31, 2002. (Year: 2002).*

Product data sheet "Poly(Ethylene Carbonate)-QPAC25", Empower Materials, retrieved on Sep. 18, 2020 (Year: 2020).*

"Terpineol" information sheet, GESTIS Substance Database, Institute for Occupational Safety and Health of the German Social Accidental Insurance, retrieved on Oct. 22, 2020. (Year: 2020).*

International Bureau of WIPO, International Preliminary Report on Patentability Issued in Application No. PCT/JP2016/077833, dated Apr. 12, 2018, WIPO, 7 pages.

ISA Japan Patent Office, International Search Report Issued in PCT Application No. PCT/JP2016/078667, dated Dec. 13, 2016, WIPO, 4 pages. (Submitted with English Translation of International Search Report).

International Bureau of WIPO, International Preliminary Report of Patentability Issued in Application No. PCT/JP2016/078667, dated Apr. 12, 2018, WIPO, 6 pages.

European Patent Office, Supplemental European Search Report Issued in Application No. 16851656.5, dated Jul. 17, 2018, Germany, 9 pages.

State Intellectual Property Office of the People's Republic of China, Office Action and Search Report Issued in Application No. 201680058259.9, dated Apr. 26, 2019, 12 pages.

European Patent Office, Extended European Search Report Issued in Application No. 16851301.8, dated Nov. 15, 2018, 7 pages.

Taiwan Intellectual Property Office, Office Action and Search Report Issued in Application No. 105131686, dated Aug. 2, 2019, 11 pages.

Japanese Patent Office, Office Action Issued in Application No. 2015-193244, dated Aug. 30, 2019, 6 pages.

Nakamoto, M., "Fine Electronic Circuit Pattern Formation on the Plastic Substrates by Metal Nanoparticle Pastes," Journal of the Japan Welding Society, vol. 76, No. 3, pp. 167-171, 2007, 5 pages. (see Remarks section of non-final Office action response submitted herewith for explanation of relevance).

Japan Patent Office, Office Action Issued in Application No. 2015-193244, dated Mar. 25, 2020, 8 pages.

China National Intellectual Property Administration, Office Action and Search Report Issued in Application No. 201680058259.9, dated Dec. 24, 2019, 10 pages.

Taiwan Intellectual Property Office, Office Action and Search Report Issued in Application No. 105131681, dated Jan. 20, 2020, 11 pages.

Vick, L. et al., "Pressureless Sintering of Polycarbonate Powder Compacted at Ambient Temperature," Polymer Engineering and Science, Dec. 1998, vol. 38, No. 12, 12 pages.

ISA Japan Patent Office, International Search Report Issued in PCT Application No. PCT/JP2016/077833, dated Dec. 20, 2016, WIPO, 2 pages. (Submitted with English Translation of International Search Report).

Technical data sheet of poly(propylene carbonate) QPAC 40, Empower Materials, available as early as Mar. 31, 2019 2 pages.

China National Intellectual Property Administration, Office Action and Search Report Issued in Application No. 201680058259.9, dated Jun. 22, 2020, 18 pages.

China National Intellectual Property Administration, Office Action and Search Report Issued in Application No. 201680058243.8, dated Aug. 5, 2020, 13 pages.

European Patent Office, Office Action Issued in Application No. 16851656.5, dated May 13, 2020, Germany, 5 pages.

Japan Patent Office, Reconsideration Report by Examiner before Appeal Issued in Application No. 2015-193244, dated Sep. 8, 2020, 9 pages.

European Patent Office, Office Action Issued in Application No. 16851301.8, dated Sep. 29, 2020, Germany, 6 pages.

* cited by examiner

SHEET AND COMPOSITE SHEET

TECHNICAL FIELD

The present invention relates to a sheet and to a composite sheet.

BACKGROUND ART

There are situations in which chips are secured to substrate using an electrically conductive adhesive comprising thermosetting resin (hereinafter "thermosetting adhesive"). However, there are cases in which it is not possible to ensure prescribed reliability—e.g., reliability as evaluated by temperature cycling testing—of power modules in which chips are secured to substrate using thermosetting adhesive.

It so happens there are technologies such as those in which paste comprising nano-sized metal particles is applied to substrate and this is sintered. For example, Patent Reference No. 1 discloses a film comprising metal particles.

PRIOR ART REFERENCES

Patent References

PATENT REFERENCE NO. 1: WO 2014/068299 A1

SUMMARY OF INVENTION

Problem to be Solved by Invention

It is possible that a great many organic substances will remain in the sintered body produced by sintering of the film—Example 17—disclosed at Patent Reference No. 1. This is because the film disclosed at Patent Reference No. 1 contains epoxy resin. Organic substances within the sintered body may cause reduced electrical conduction and/or reduced reliability during film temperature cycling testing.

It is an object of the present invention to provide a sheet having a pre-sintering layer which is such that a sintered body resulting therefrom will have a small amount of remaining organic substances. It is also an object of the present invention to provide a composite sheet having a pre-sintering layer which is such that a sintered body resulting therefrom will have a small amount of remaining organic substances.

Means for Solving Problem

The present invention relates to a sheet comprising a pre-sintering layer. The pre-sintering layer comprises polycarbonate. The amount of organic substances remaining in a sintered body resulting from sintering of the pre-sintering layer is likely to be less than that which would remain in a sintered body resulting from sintering of a film containing epoxy resin. This is because polycarbonate will more effectively undergo pyrolysis as a result of sintering than would be the case with epoxy resin. A sheet in accordance with the present invention is therefore more likely to excel in terms of reliability of the sintered body produced therefrom—i.e., reliability during temperature cycling testing—than would be the case with a film containing epoxy resin.

The present invention also relates to a composite sheet. The composite sheet may comprise a release liner, a pre-sintering layer arranged over the release liner, and a dicing sheet arranged over the pre-sintering layer.

The present invention also relates to a power module manufacturing method. A power module manufacturing method in accordance with the present invention comprises an Operation (a) in which a sheet, which comprises a dicing sheet and a pre-sintering layer arranged over the dicing sheet, is affixed to a semiconductor wafer. A power module manufacturing method in accordance with the present invention further comprises an Operation (b) in which pre-sintering chip(s), each of which comprises a semiconductor chip and pre-sintering film arranged over the semiconductor chip, are formed as a result of dicing following Operation (a). A power module manufacturing method in accordance with the present invention further comprises an Operation (c) in which pre-sintering chip(s) are compression-bonded to bonding target(s), and an Operation (d) in which sintering of pre-sintering film is carried out following Operation (c).

EMBODIMENTS FOR CARRYING OUT INVENTION

Although the present invention is described in detail below in terms of embodiments, it should be understood that the present invention is not limited only to these embodiments.

Embodiment 1

—Composite Sheet 1—

Figure 1:
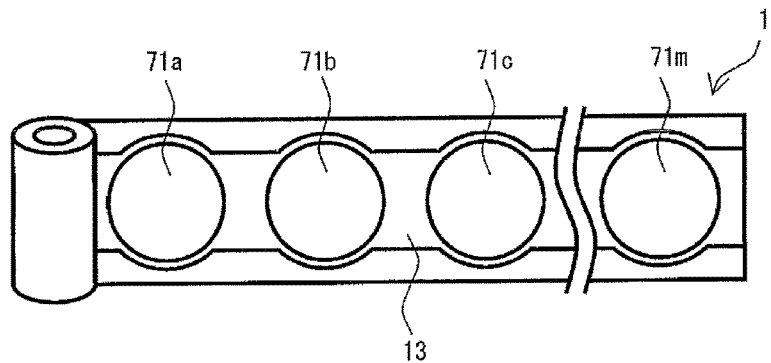
FIG. 1 Schematic plan view of a composite sheet.

As shown in FIG. 1, composite sheet 1 is in the form of a roll. Composite sheet 1 comprises release liner 13 and sheets 71a, 71b, 71c, . . . 71m (hereinafter collectively referred to as "sheets 71") disposed on release liner 13. The distance between sheet 71a and sheet 71b, the distance between sheet 71b and sheet 71c, . . . and the distance between sheet 71l and sheet 71m, is constant.

Figure 2:
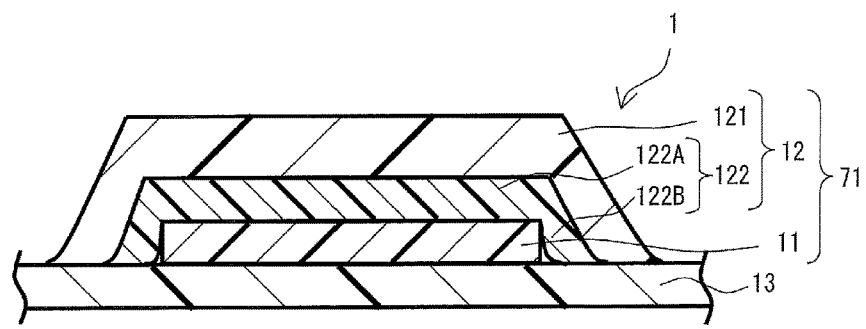
FIG. 2 Schematic sectional diagram of a portion of a composite sheet.

As shown in FIG. 2, sheet 71 comprises pre-sintering layer 11. Sheet 71 further comprises dicing sheet 12 arranged over pre-sintering layer 11. Dicing sheet 12 comprises base 121 and adhesive layer 122 arranged over base 121. The two faces of pre-sintering layer 11 may be defined such that there is a first principal plane that is in contact with adhesive layer 122 and a second principal plane that is opposite the first principal plane. The second principal plane is in contact with release liner 13.

Adhesive layer 122 comprises first portion 122A. First portion 122A is cured. First portion 122A is in contact with pre-sintering layer 11. Adhesive layer 122 further comprises second portion 122B arranged peripherally with respect to first portion 122A. Second portion 122B has a property such that it may be cured by means of an energy beam. As energy beam, ultraviolet beams and the like may be cited as examples. Second portion 122B is not in contact with pre-sintering layer 11.

Pre-sintering layer 11 has a property such that it may be made into a sintered body through application of heat. Pre-sintering layer 11 may be used to form a joint between a first object and a second object. This might, for example, be a joint between a chip and a substrate. The base may comprise an insulator base and a conductor layer arranged over the insulator base. As insulator base, ceramic bases and so forth may be cited as examples.

It is preferred that thickness of pre-sintering layer 11 be not less than 30 μm, and more preferred that this be not less than 40 μm. It is preferred that thickness of pre-sintering layer 11 be not greater than 200 μm, more preferred that this be not greater than 150 μm, and still more preferred that this be not greater than 100 μm.

The DTA curve for pre-sintering layer 11 plotted by means of TG-DTA from 23° C. to 500° C. at a temperature rise rate of 10° C./min in air has at least one peak between 150° C. and 350° C. but has no peak in the range above 350° C. When the DTA curve has a peak in the range above 350° C., this may cause a large amount of organic substances to remain following sintering.

Pre-sintering layer 11 comprises polycarbonate. Polycarbonate may serve as binder. It is preferred that the polycarbonate be solid at 23° C. If this is solid at 23° C., it will facilitate molding of pre-sintering layer 11.

It is preferred that the polycarbonate have a property such that it undergoes pyrolysis when sintered. For example, this may be a property such that carbon concentration is not greater than 15 wt % following an increase in temperature from 23° C. to 400° C. at a temperature rise rate of 10° C./min in air. Carbon concentration may be measured by means of energy dispersive x-ray analysis.

It is preferred that the percent weight loss of polycarbonate at 300° C. be greater than or equal to 95%. When this is greater than or equal to 95%, there will be a small amount of polycarbonate following sintering. It is preferred that the temperature at which the weight of polycarbonate decreases by 5% as measured by TG-DTA with temperature increasing by 10° C./min is less than or equal to 260° C. When this is less than or equal to 260° C., there will be a small amount of polycarbonate following sintering.

It is preferred that the weight-average molecular weight of polycarbonate be not less than 10,000, more preferred that this be not less than 30,000, and still more preferred that this be not less than 50,000. It is preferred that the weight-average molecular weight of polycarbonate be not greater than 1,000,000, more preferred that this be not greater than 500,000, and still more preferred that this be not greater than 350,000. Weight-average molecular weight is measured using GPC (gel permeation chromatography) and is expressed as the polystyrene equivalent value.

The polycarbonate might, for example, be aliphatic polycarbonate. It is preferred that the aliphatic polycarbonate be such that there are no aromatic compounds (e.g., benzene rings) between carbonate ester (—O—CO—O—) groups in the main chain. It is preferred that the aliphatic polycarbonate be such that there is/are aliphatic chain(s) between carbonate ester groups in the main chain. The aliphatic polycarbonate might, for example, be polypropylene carbonate, polyethylene carbonate, or tert-butyl ethylene carbonate. Of these, polypropylene carbonate is preferred. This is because it will effectively undergo pyrolysis when sintered.

For every 100 wt % of pre-sintering layer 11, it is preferred that polycarbonate be present in an amount that is not less than 0.5 wt %, and more preferred that this be not less than 1 wt %. For every 100 wt % of pre-sintering layer 11, it is preferred that polycarbonate be present in an amount that is not greater than 20 wt %, more preferred that this be not greater than 15 wt %, still more preferred that this be not greater than 10 wt %, and even still more preferred that this be not greater than 5 wt %.

Pre-sintering layer 11 comprises metal particles. These might be silver particles, copper particles, silver oxide particles, copper oxide particles, and/or the like. Pre-sintering layer 11 may comprise a single type of metal particles or it may comprise two or more types thereof. It is preferred that the metal particles have a property such that they become a sintered body when temperature is increased from 80° C. to 300° C. at a temperature rise rate of 1.5° C./second and is held at 300° C. for 2.5 minutes.

The lower limit of the range in values for the average particle diameter of the metal particles might, for example, be 0.05 nm, 0.1 nm, or 1 nm. The upper limit of the range in values for the average particle diameter of the metal particles might, for example, be 1000 nm or 100 nm. D50 data obtained as a result of measurements in standard mode using a particle size analyzer (Microtrac HRA manufactured by Nikkiso Co., Ltd.) is taken to be the average particle diameter.

For every 100 wt % of pre-sintering layer 11, it is preferred that metal particles be present in an amount that is not less than 50 wt %, more preferred that this be not less than 60 wt %, and still more preferred that this be not less than 65 wt %. For every 100 wt % of pre-sintering layer 11, it is preferred that metal particles be present in an amount that is not greater than 98 wt %, more preferred that this be not greater than 97 wt %, and still more preferred that this be not greater than 95 wt %.

Pre-sintering layer 11 further comprises a binder that has a boiling point between 100° C. and 350° C. (hereinafter "low-boiling-point binder").

A method such as one in which a varnish containing polycarbonate, metal particles, and so forth is prepared; a support body is coated with the varnish; and the varnish is dried might be employed to obtain pre-sintering layer 11. The solvent for the varnish might, for example, be methyl ethyl ketone.

It is preferred that thickness of adhesive layer 122 be not less than 3 μm, and more preferred that this be not less than 5 μm. It is preferred that thickness of adhesive layer 122 be not greater than 50 μm, and more preferred that this be not greater than 30 μm.

Adhesive layer 122 is formed from adhesive. The adhesive might, for example, acrylic adhesive and/or rubber-type adhesive. Of these, acrylic adhesive is preferred. The acrylic adhesive might, for example, be an acrylic adhesive in which the base polymer thereof is an acrylic polymer (homopolymer or copolymer) employing one, two, or more varieties of (meth)acrylic acid alkyl ester as monomer component(s).

It is preferred that thickness of base 121 be 50 μm to 150 μm. It is preferred that base 121 have a property such that an energy beam is transmitted therethrough.

It is preferred that thickness of release liner 13 be 20 μm to 75 μm, and more preferred that this be 25 μm to 50 μm. As release liner 13, polyethylene terephthalate (PET) film and the like may be cited as examples.

—Power Module Manufacturing Method—

Figure 3:
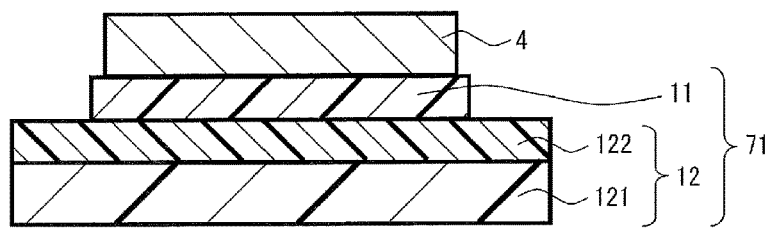
FIG. 3 Schematic sectional diagram showing an operation for manufacturing a power module.

As shown in FIG. 3, sheet 71 is affixed to semiconductor wafer 4. Semiconductor wafer 4 might, for example, be a silicon wafer, silicon carbide wafer, gallium nitride wafer, or the like. Affixing might, for example, be carried out at 70° C. to 80° C.

Figure 4:
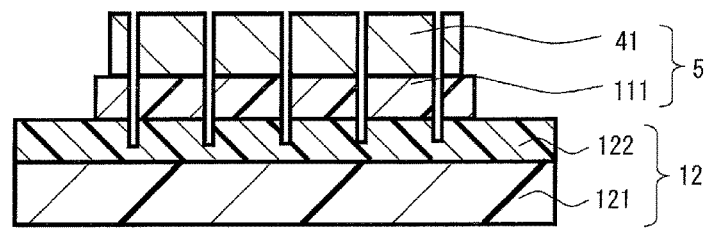
FIG. 4 Schematic sectional diagram showing an operation for manufacturing a power module.

As shown in FIG. 4, pre-sintering chips 5 are formed as a result of dicing of semiconductor wafer 4. Pre-sintering chip 5 comprises semiconductor chip 41 and pre-sintering film 111 which is arranged over semiconductor chip 41.

Pick-up of pre-sintering chip 5 is carried out. That is, needle(s) are used to push up pre-sintering chip 5, grab it, and remove it from adhesive layer 122.

Figure 5:
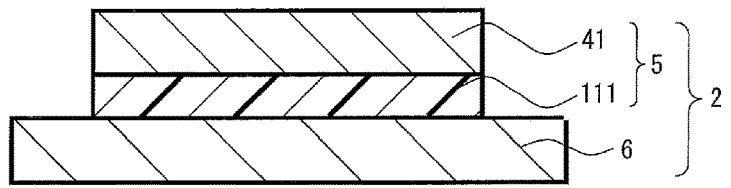
FIG. 5 Schematic sectional diagram showing an operation for manufacturing a power module.

As shown in FIG. 5, pre-sintering composite body 2 is obtained as a result of compression-bonding of pre-sintering chip 5 to bonding target 6. Compression-bonding might, for example, be carried out at 80° C. to 100° C. Bonding target 6 might, for example, be a substrate, lead frame, interposer, TAB film, semiconductor, or the like. Pre-sintering composite body 2 comprises bonding target 6, semiconductor chip 41, and pre-sintering film 111 which is sandwiched between bonding target 6 and semiconductor chip 41.

Sintering of pre-sintering film 111 is carried out. That is, pre-sintering composite body 2 is heated while a force is applied to pre-sintering composite body 2 by means of plate(s) to cause pre-sintering film 111 to become a sintered body. The lower limit of the range in values for the sintering temperature might, for example, be 200° C. or 250° C. The upper limit of the range in values for the sintering temperature might, for example, be 320° C. or 350° C. The lower limit of the range in values for the pressure which is applied to pre-sintering composite body 2 might, for example, be 1 MPa or 5 MPa. The upper limit of the range in values for the pressure which is applied to pre-sintering composite body 2 might, for example, be 20 MPa or 30 MPa.

Figure 6:
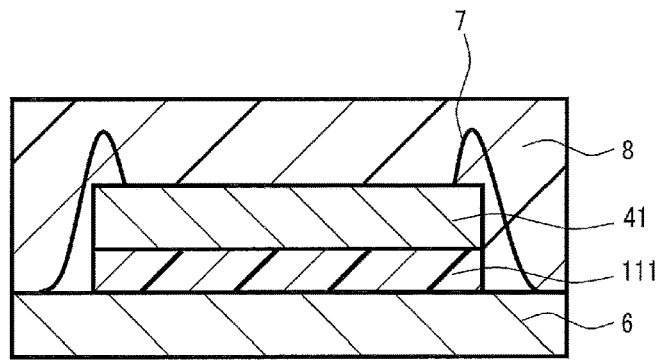
FIG. 6 Schematic sectional diagram showing an operation for manufacturing a power module.

As shown in FIG. 6, the electrode pads of semiconductor chip 41 and the terminal portions of bonding target 6 are electrically connected by means of bonding wire 7. Bonding wire 7 might, for example, be aluminum wire, gold wire, or copper wire.

Following wire bonding, semiconductor chips 41 are sealed with resin sealant 8. Following sealing, further heating may be carried out. This will make it possible to achieve complete curing of resin sealant 8 where this had been insufficiently carried out.

A power module obtained in accordance with the foregoing method comprises bonding target 6, semiconductor chip 41, and a sintered body which is sandwiched between bonding target 6 and semiconductor chip 41. The power module further comprises resin sealant 8 with which semiconductor chip 41 is covered.

As described above, a method for manufacturing a power module comprises Operation (a) in which sheet 71 is affixed to semiconductor wafer 4; Operation (b) in which pre-sintering chip 5 is formed as a result of dicing following Operation (a); Operation (c) in which pre-sintering chip 5 is compression-bonded to bonding target 6; and Operation (d) in which sintering of pre-sintering film 111 is carried out following Operation (c). Operation (d) comprises a step in which pre-sintering composite body 2 is heated.

A method for manufacturing a power module further comprises, following Operation (d), Operation (e) comprising a step in which a joint is formed between a first end of bonding wire 7 and semiconductor chip 41, and a step in which a joint is formed between a second end of bonding wire 7 and bonding target 6. A method for manufacturing a power module further comprises Operation (f) in which semiconductor chip 41 is sealed with resin sealant 8.

—Variation 1—

First portion 122A of adhesive layer 122 has a property such that it may be cured by means of an energy beam. Second portion 122B of adhesive layer 122 also has a property such that it may be cured by means of an energy beam. A method for manufacturing a power module further comprises, following Operation (b) in which pre-sintering chip 5 is formed, an operation in which adhesive layer 122 is irradiated with an energy beam and pick-up of pre-sintering chip 5 is carried out. Irradiating this with an energy beam facilitates pick-up of pre-sintering chip 5.

—Variation 2—

First portion 122A of adhesive layer 122 is cured by means of an energy beam. Second portion 122B of adhesive layer 122 is also cured by means of an energy beam.

—Variation 3—

Pre-sintering layer 11 constitutes a multilayer structure comprising a first layer and a second layer which is arranged over the first layer.

—Variation 4—

Figure 7:
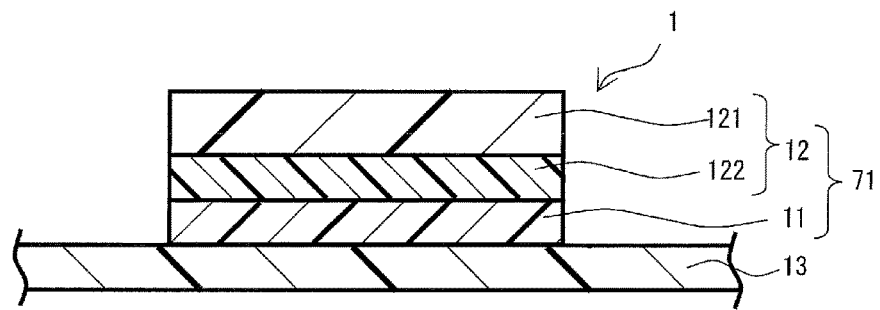
FIG. 7 Schematic sectional diagram of a portion of the composite sheet of Variation 4.

As shown in FIG. 7, the entire surface of one side of adhesive layer 122 is in contact with pre-sintering layer 11. Adhesive layer 122 has a property such that it may be cured by means of an energy beam. A method for manufacturing a power module further comprises, following Operation (b) in which pre-sintering chip 5 is formed, an operation in which adhesive layer 122 is irradiated with an energy beam and pick-up of pre-sintering chip 5 is carried out.

—Variation 5—

Figure 8:
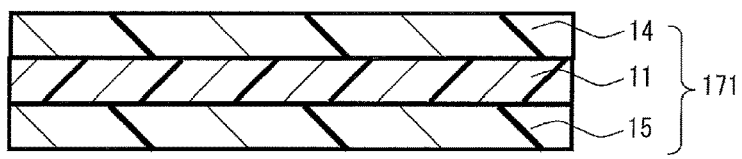
FIG. 8 Schematic sectional diagram showing the sheet of Variation 5.

As shown in FIG. 8, sheet 171 comprises pre-sintering layer 11. The two faces of pre-sintering layer 11 may be defined such that there is a first face and a second face opposite the first face. Sheet 171 further comprises first release liner 14 arranged over the first face and second release liner 15 arranged over the second face —Other Variations—

Any of Variation 1 through Variation 5 and/or the like may be combined as desired.

WORKING EXAMPLES

Although working examples are employed below to describe the present invention in more specific terms, it should be understood that the present invention, inasmuch as it does not go beyond the gist thereof, is not to be limited by the following working examples.

Raw Materials and so Forth for Pre-Sintering Sheet

Silver paste: ANP-1 manufactured by Applied Nanoparticle Laboratory Corporation (paste in which nano-sized silver microparticles are dispersed in binder) in which amount of solvent for adjustment of viscosity comprised thereby was adjusted as appropriate.

Solvent: Methyl Ethyl Ketone (MEK)

Polycarbonate: QPAC40 (polypropylene carbonate of weight-average molecular weight 50,000 to 350,000) manufactured by Empower Acrylic polymer: MM-2002-1 manufactured by Fujikura Kasei Co., Ltd.

Fabrication of Pre-Sintering Sheet

Respective components and solvent were placed in the agitation vessel of a hybrid mixer (HM-500 manufactured by Keyence Corporation) as listed at TABLE 1 and made to undergo agitation for 8 minutes at 2000 rpm to obtain a varnish. The varnish was used to coat mold-release-treated film (MRA38 manufactured by Mitsubishi Plastics, Inc.). This was dried for 3 minutes at 110° C. to obtain a pre-sintering sheet.

Evaluation 1: Reliability

A chip was prepared that had a silicon chip of thickness 350 µm, length 5 mm, and width 5 mm; a Ti film of thickness 50 nm provided at the backside of the silicon chip; and an Ag film of thickness 100 nm provided over the Ti film. A pre-sintering sheet was affixed to the Ag film of the chip under conditions of 70° C., 0.3 MPa, and 10 mm/sec to fabricate a pre-sintering-sheet-bearing chip. The pre-sintering-sheet-bearing chip was arranged over an Ag-plated Cu substrate which had a Cu substrate of thickness 3 mm and an Ag film of thickness 5 µm that covered the entirety of the Cu substrate. A sintering apparatus (HTM-3000 manufactured by Hakuto Co., Ltd.) was used to carry out sintering, causing a joint to be formed between the Ag-plated Cu substrate and the chip. More specifically, a joint was formed by using a flat press to apply a pressure of 10 MPa as temperature was increased from 80° C. to 300° C. at a temperature rise rate of 1.5° C./second, and to apply a pressure of 10 MPa as this was maintained at 300° C. for 2.5 minutes.

The sample obtained as a result of formation of the joint between the Ag-plated Cu substrate and the chip was subjected to 100 cycles of temperature variation using a thermal shock test apparatus (TSE-103ES manufactured by Espec Corp.). Each cycle consisted of a first time period during which temperature was maintained at −40° C. for 15 minutes and a second time period during which temperature was maintained at 200° C. for 15 minutes. After 100 cycles, an ultrasonic imaging apparatus (FineSAT II manufactured by Hitachi Kenki FineTech Co., Ltd.) was used to observe the sample. A PQ-50-13: WD (frequency 50 MHz) probe was used. Area of the portion of the joint which remained in the image that was obtained (hereinafter "remaining area") was determined. Taking total area to be 100%, the fractional remaining area was calculated. Fractional remaining area was evaluated as GOOD if it was greater than or equal to 50%. This was evaluated as BAD if it was lower than 50%. Results are shown in TABLE 1.

Evaluation 2: Silver Microparticle Content

Silver microparticle content was determined by means of TG-DTA when temperature was increased from 23° C. to 500° C. at a temperature rise rate of 10° C./min. Results are shown in TABLE 1.

TABLE 1

|  |  | Working Example 1 | Working Example 2 | Comparative Example 1 |
|---|---|---|---|---|
| Amount | Silver paste g | 3 | 3 | 3 |
|  | Solvent g | 2.1 | 2.1 | 2.1 |
|  | Polycarbonate g | 0.03 | 0.06 | — |
|  | Acrylic polymer g | — | — | 0.03 |
| Evaluation | Silver microparticle content within 100 wt % of pre-sintering sheet wt % | 94.5 | 93.8 | 94.5 |
|  | Polycarbonate content within 100 wt % of pre-sintering sheet wt % | 1.0 | 2.0 | — |
|  | Reliability | GOOD | GOOD | BAD |

Working Examples 1 and 2, these being examples in which polycarbonate was blended therein, had better reliability during temperature variation testing than Comparative Example 1.

Evaluation 3: Miscellaneous
Polycarbonate Evaluation

Percent weight loss of polycarbonate at 300° C. was greater than or equal to 95%. Percent weight loss was measured using TG-DTA. The temperature at which the weight of polycarbonate decreased by 5% as measured by TG-DTA with temperature increasing by 10° C./min was less than or equal to 260° C.

Evaluation of Pre-Sintering Sheet

Figure 9:
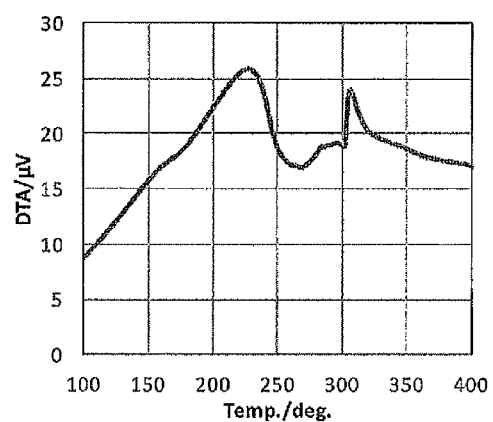
FIG. 9 DTA curve for Working Example 1.

Measurement samples were cut from the pre-sintering sheet of Working Example 1. TG-DTA was used to plot a DTA curve. Temperature was increased from 23° C. to 500° C. at a temperature rise rate of 10° C./min in air. The DTA curve is shown in FIG. 9.

REFERENCE CHARACTERS LIST

1 Composite sheet
11 Pre-sintering layer
12 Dicing sheet
13 Release liner
71 Sheet
121 Base
122 Adhesive layer
122A First portion
122B Second portion
2 Pre-sintering composite body
4 Semiconductor wafer
5 Pre-sintering chip
41 Semiconductor chip
111 Pre-sintering film
6 Bonding target
7 Bonding wire
8 Resin sealant
171 Sheet
14 First release liner
15 Second release liner

The invention claimed is:

1. A sheet comprising a pre-sintering layer,
    wherein the pre-sintering layer comprises polycarbonate and metal particles,
    wherein the metal particles have a property such that they become a sintered body when a temperature of the metal particles is increased from 80° C. to 300° C. at a temperature rise rate of 1.5° C./second and is held at 300° C. for 2.5 minutes,
    wherein the polycarbonate has a property such that carbon concentration is not greater than 15 wt % following an increase in temperature from 23° C. to 400° C. at a temperature rise rate of 10° C./min in air,
    wherein a DTA curve for the pre-sintering layer plotted by TG-DTA from 23° C. to 500° C. at a temperature rise rate of 10° C./min in air has at least one peak between 150° C. and 350° C. but has no peak in a range above 350° C.,
    wherein the pre-sintering layer further comprises a binder that has a boiling point between 100° C. and 350° C.,
    wherein two faces of the pre-sintering layer are defined such that there is a first face and a second face opposite the first face; and further comprising a first release liner arranged over the first face; and a second release liner arranged over the second face.

2. The sheet according to claim 1 wherein the metal particles comprise at least one species selected from among the group consisting of silver particles, copper particles, silver oxide particles, and copper oxide particles.

3. The sheet according to claim 1 wherein the metal particles are present in an amount that is 50 wt % to 98 wt % per 100 wt % of the pre-sintering layer.

4. The sheet according to claim 1 wherein the pre-sintering layer is used to form a joint between a first object and a second object.

5. The sheet according to claim 1 wherein thickness of the pre-sintering layer is not less than 30 μm.

6. The sheet according to claim 1 wherein thickness of the pre-sintering layer is not greater than 200 μm.

7. The sheet according to claim 1 wherein the polycarbonate is solid at 23° C.

8. The sheet according to claim 1 wherein the polycarbonate comprises aliphatic polycarbonate.

9. The sheet according to claim 1 wherein the polycarbonate comprises at least one species selected from among the group consisting of polypropylene carbonate, polyethylene carbonate, and tert-butyl ethylene carbonate.

10. The sheet according to claim 1 wherein the polycarbonate comprises polypropylene carbonate.

11. The sheet according to claim 1 wherein an average particle diameter of the metal particles is not greater than 1000 nm.

12. The sheet according to claim 1 wherein an average particle diameter of the metal particles is not greater than 100 nm.

13. The sheet according to claim 1 wherein a thickness of the pre-sintering layer is not less than 30 μm and is not greater than 200 μm.

14. A sheet comprising a pre-sintering layer,
wherein the pre-sintering layer comprises polycarbonate and metal particles,
wherein the metal particles have a property such that they become a sintered body when a temperature of the metal particles is increased from 80° C. to 300° C. at a temperature rise rate of 1.5° C./second and is held at 300° C. for 2.5 minutes,
wherein the polycarbonate has a property such that carbon concentration is not greater than 15 wt % following an increase in temperature from 23° C. to 400° C. at a temperature rise rate of 10° C./min in air,
wherein a DTA curve for the pre-sintering layer plotted by TG-DTA from 23° C. to 500° C. at a temperature rise rate of 10° C./min in air has at least one peak between 150° C. and 350° C. but has no peak in a range above 350° C.,
wherein the pre-sintering layer comprises a binder that has a boiling point between 100° C. and 350° C.,
wherein the sheet further comprising a dicing sheet arranged over the pre-sintering layer.

15. The sheet according to claim 14, wherein the metal particles comprise at least one species selected from among the group consisting of silver particles, copper particles, silver oxide particles, and copper oxide particles.

16. The sheet according to claim 14, wherein the metal particles are present in an amount that is 50 wt % to 98 wt % per 100 wt % of the pre-sintering layer.

17. The sheet according to claim 14, wherein the pre-sintering layer is used to form a joint between a first object and a second object.

18. A composite sheet comprising a release liner; and the sheet according to claim 14 arranged over the release liner.

19. The sheet according to claim 14, wherein the polycarbonate comprises aliphatic polycarbonate.

20. The sheet according to claim 14, wherein the polycarbonate comprises polypropylene carbonate.

* * * * *